(12) United States Patent
Balonek et al.

(10) Patent No.: US 11,335,724 B2
(45) Date of Patent: May 17, 2022

(54) MARKING SYSTEM AND METHOD

(71) Applicant: LMD Applied Science, LLC, Rochester, NY (US)

(72) Inventors: Daniel J. Balonek, Bergen, NY (US); Christopher A. Gagliano, Rochester, NY (US); Susan Houde-Walter, Rush, NY (US)

(73) Assignee: LMD Applied Science, LLC, Rochester, NY (US)

( * ) Notice: Subject to any disclaimer, the term of this patent is extended or adjusted under 35 U.S.C. 154(b) by 0 days.

(21) Appl. No.: 16/666,279

(22) Filed: Oct. 28, 2019

(65) Prior Publication Data

US 2021/0074757 A1    Mar. 11, 2021

Related U.S. Application Data

(63) Continuation of application No. 15/089,782, filed on Apr. 4, 2016, now Pat. No. 10,461,114, which is a
(Continued)

(51) Int. Cl.
| | |
|---|---|
| *H01L 27/146* | (2006.01) |
| *G01J 5/08* | (2022.01) |
| *F41G 3/14* | (2006.01) |
| *F41G 1/36* | (2006.01) |
| *H04N 5/33* | (2006.01) |
| *H04N 3/09* | (2006.01) |
| *G02B 23/12* | (2006.01) |

(52) U.S. Cl.
CPC .......... *H01L 27/14649* (2013.01); *F41G 1/36* (2013.01); *F41G 3/145* (2013.01); *G01J 5/0896* (2013.01); *G02B 23/12* (2013.01); *H04N 3/09* (2013.01); *H04N 5/33* (2013.01)

(58) Field of Classification Search
CPC .... H01L 27/14649; G02B 23/12; H04N 3/09; H04N 5/33; F41G 1/36; F41G 3/145; G01J 5/0896
See application file for complete search history.

(56) References Cited

U.S. PATENT DOCUMENTS

| | | | |
|---|---|---|---|
| 3,465,352 A | | 9/1969 | Carlson et al. |
| 4,497,065 A | * | 1/1985 | Tisdale ................. G01S 7/4802 382/103 |

(Continued)

FOREIGN PATENT DOCUMENTS

| | | |
|---|---|---|
| WO | WO2009067807 | 6/2009 |
| WO | WO2010/001402 | 1/2010 |

OTHER PUBLICATIONS

Final Office Action dated Mar. 14, 2019 for U.S. Appl. No. 15/089,782 "Marking System and Method" Balonek, 11 pages.
(Continued)

*Primary Examiner* — David P Porta
*Assistant Examiner* — Jeremy S Valentiner
(74) *Attorney, Agent, or Firm* — Lee & Hayes, P.C.

(57) ABSTRACT

A system for use in identifying a user includes a portable emitter transported with the user. The emitter includes a quantum cascade laser configured to emit a thermal beam identifying a location of the user in response to a command, the thermal beam having a wavelength between approximately 2 μm and approximately 30 μm.

20 Claims, 7 Drawing Sheets

Related U.S. Application Data continuation of application No. 13/440,185, filed on Apr. 5, 2012, now Pat. No. 9,305,963.

(60) Provisional application No. 61/473,575, filed on Apr. 8, 2011.

(56) References Cited

U.S. PATENT DOCUMENTS

| | | | |
|---|---|---|---|
| 4,713,544 | A | 12/1987 | Grage |
| 4,737,028 | A * | 4/1988 | Smith ................ G01S 17/66 244/3.13 |
| 4,939,369 | A | 7/1990 | Elabd |
| 5,530,714 | A | 6/1996 | Vilhelmsson et al. |
| 5,910,767 | A | 6/1999 | Frucht |
| 6,362,872 | B1 | 3/2002 | Berdanier |
| 2003/0047683 | A1 | 3/2003 | Kaushal |
| 2003/0173517 | A1 | 9/2003 | Seto |
| 2003/0174315 | A1 | 9/2003 | Byren et al. |
| 2004/0004707 | A1 * | 1/2004 | DeFlumere ........... G01S 17/86 356/4.01 |
| 2004/0119020 | A1 | 6/2004 | Bodkin |
| 2005/0133709 | A1 | 6/2005 | Mekata et al. |
| 2005/0230623 | A1 | 10/2005 | Remillard et al. |
| 2005/0242508 | A1 | 11/2005 | Meichner |
| 2006/0106371 | A1 | 5/2006 | Muhlhoff et al. |
| 2006/0232761 | A1 | 10/2006 | McConville et al. |
| 2006/0238617 | A1 | 10/2006 | Tamir |
| 2009/0100995 | A1 * | 4/2009 | Fisher ................. F42B 15/01 89/1.11 |
| 2009/0110019 | A1 * | 4/2009 | Houde-Walter ........ F41G 1/36 372/55 |
| 2009/0224153 | A1 * | 9/2009 | Houde-Walter ....... B82Y 20/00 250/330 |
| 2009/0224154 | A1 * | 9/2009 | Jancic .................... F41G 1/35 250/330 |
| 2009/0251915 | A1 | 10/2009 | Boroczki et al. |
| 2009/0289187 | A1 | 11/2009 | Mian |
| 2010/0141503 | A1 | 6/2010 | Baumatz |
| 2010/0179785 | A1 * | 7/2010 | Jensen ................. G01J 5/0275 702/135 |
| 2010/0243891 | A1 | 9/2010 | Day et al. |
| 2012/0212619 | A1 | 8/2012 | Nagamune |
| 2016/0255285 | A1 | 9/2016 | Balonek et al. |

OTHER PUBLICATIONS

Office action for U.S. Appl. No. 13/440,185, dated Jul. 19, 2013, Balonek et al., "Marking System and Method", 15 pages.

Office Action for U.S. Appl. No. 13/440,185, dated Nov. 13, 2014, Daniel Joseph Balonek, "Marking System and Method", 20 pages.

Non Final Office Action dated Nov. 30, 2018 for U.S. Appl. No. 15/089,782 "Marking System and Method" Balonek, 30 pages.

Office action for U.S. Appl. No. 15/089,782, dated Feb. 3, 2017, Balonek et al., "Marking System and Method", 31 pages.

Office action for U.S. Appl. No. 13/440,185, dated Apr. 3, 14, Balonek et al., "Marking System and Method", 22 pages.

Office Action for U.S. Appl. No. 15/089,782, dated May 7, 2018, Balonek, "Marking System and Method", 30 pages.

Office action for U.S. Appl. No. 15/089,782, dated Jun. 24, 2016, Balonek et al., "Marking System and Method", 21 pages.

Office Action for US Patent Application dated Sep. 7, 2017, Balonek, "Marking System and Method", 31 pages.

Pralle, et al., "High-visibility infrared beacons for IFF and combat ID", retrieved on Mar. 11, 2019 at <<https://www.spiedigitallibrary.org/conference-proceedings-of-spie>>, SPIE, May 19, 2005.

* cited by examiner

MARKING SYSTEM AND METHOD

CROSS-REFERENCE TO RELATED APPLICATIONS

This application is a continuation of U.S. patent application Ser. No. 15/089,782, filed Apr. 4, 2016, which is a continuation of U.S. patent application Ser. No. 13/440,185, filed Apr. 5, 2012, now U.S. Pat. No. 9,305,963, Issued Apr. 5, 2016, which is a nonprovisional application of, and claims priority to, U.S. Provisional Application No. 61/473,575, filed Apr. 8, 2011, the entire disclosures of each of the above applications are incorporated herein by reference.

STATEMENT REGARDING FEDERALLY SPONSORED RESEARCH OR DEVELOPMENT

Not applicable.

REFERENCE TO A "SEQUENCE LISTING"

Not applicable.

BACKGROUND OF THE INVENTION

Field of the Invention

The present disclosure relates to marking systems and, in particular, systems useful in marking a target with a thermal designation.

Description of Related Art

Manned vehicles are heavily used in various environments for reconnaissance, aerial photography, combat activities, rescue efforts, law enforcement, security exercises, and other purposes. Such vehicles may include aerial vehicles such as reconnaissance aircraft, helicopters, jets, and airplanes. Such vehicles may also include ground vehicles such as tanks, troop transports, armored assault vehicles, motorcycles, and automobiles. Such vehicles may further include aqueous and/or subaqueous vehicles such as boats, rafts, battleships, submarines, and, amphibious or semi-amphibious vehicles. Each of these manned vehicles may be employed by various users in the vicinity of unfriendly forces or other potentially dangerous areas. In these environments it can be difficult for friendly forces to distinguish between friendly vehicles and unfriendly or foe vehicles, and this difficulty can be heightened under the stress of combat situations and/or other situations common in dangerous areas.

It is understood that known markers, locating lasers, beacons, or other like beam emitters can be connected to and/or otherwise associated with such manned vehicles to assist in locating and/or identifying the vehicles at moderate distances. However, these known emitters are plagued by a host of debilitating drawbacks that make them inefficient or potentially dangerous for use in some dangerous environments. For instance, while radiation emitted by many emitters is clearly visible by conventional night vision goggles, cellular phone displays, or other like viewing devices, such viewing devices are widely available and used by both friendly forces and unfriendly groups. Thus, friendly vehicles equipped with known emitters can easily be detected by unfriendly groups, making stealth or covert operation of such vehicles difficult, if not impossible.

In addition, most known emitters are not easily programmable or modifiable in the field, and are not configured to emit beams having a diverse range of, for example, encryption signatures, wavelengths, and/or other characteristics. As a result, it is relatively easy for unfriendly groups to "disguise" their vehicles by programming the emitters associated with such vehicles to emit substantially the same beam as that emitted by, for example, a friendly emitter. Such ease of deception can be very dangerous in certain environments.

Moreover, some known emitters, such as thermal markers or other devices emitting beams in the thermal band, may have a limited detection range. For example, while friendly forces and vehicles may be equipped with known thermal markers for friend or foe identification, the signals emitted by these devices may not be easily detected beyond a range of several hundred meters. This range may be relevant in a tightly confined arena of engagement, but such a limited range can put friendly forces at risk when vehicles are used. For example, manned vehicles such as the ground, aerial, and/or aqueous vehicles discussed above can move at high rates of speed and may approach or operate (in the case of aerial vehicles) at distances greater than 1 km from the engagement arena. Not being able to detect a vehicle, or determine whether or not the detected vehicle is friendly, unless and until the vehicle is within several hundred meters of, for example, an engagement arena or other area occupied by friendly forces, can put these forces at serious risk.

Moreover, the manned vehicles described herein may also employ emitters in various environments to mark and/or otherwise convey information about an object, location, and/or target. Such information may include, for example, whether or not to engage the marked object, or the location of the target, hidden resources, friendly forces, a distressed friendly soldier, or checkpoints along a path. However, known emitters may not be suitable for use with such devices due to the deficiencies discussed above. For example, beams emitted by known emitters may not be easily seen from great distances, thus making locating such devices difficult. Moreover, once such emitters are deactivated or the target has moved out of the beam path, the designation and/or other marking on the target dissipates almost instantaneously, making it very difficult for friendly forces to produce a sustained thermal designation on such targets. In addition, most known emitters are not capable of effectively thermally marking targets having an elevated temperature, such as, for example, a temperature above room temperature. If the target is, for example, a human being, an engine, or other target having an elevated temperature, such emitters may not be useful for their intended purpose.

The various embodiments set forth in the present disclosure are directed toward overcoming the problems discussed above.

BRIEF SUMMARY OF THE INVENTION

In an exemplary embodiment of the present disclosure, a target marking method includes forming a thermal designation on a target with an emitter associated with an unmanned vehicle. The emitter includes at least one quantum cascade laser and forms the designation with a thermal beam having a wavelength between approximately 2 μm and approximately 30 μm. The method also includes viewing the designation with a thermal imager and taking action in response to the viewing.

In a further exemplary embodiment of the present disclosure, a target marking method includes marking a moving target selected from a plurality of moving targets with a thermal designation formed by a moveably mounted emitter. The emitter includes at least one quantum cascade laser and forms the designation by impinging a thermal beam on the target, the thermal beam having a wavelength between approximately 2 µm and approximately 30 µm. The method also includes viewing the designation with a thermal imager and taking action in response to the viewing.

In still another exemplary embodiment of the present disclosure, a target marking method includes selecting a target from among a plurality of potential targets and marking the target with a thermal designation by impinging a thermal beam on an article worn by the target. The thermal beam has a wavelength between approximately 2 µm and approximately 30 µm, and the article is made from a predetermined, highly thermally absorbent material. Such a method also includes viewing the designation with a thermal imager and taking action in response to the viewing.

In another exemplary embodiment of the present disclosure, a marking method includes connecting an emitter to a portable article, the emitter including at least one quantum cascade laser. The method also includes transporting the emitter, via the article, from a first location to a second location different than the first location. Such a method further includes emitting a first thermal beam with the at least one quantum cascade laser, the first thermal beam having a wavelength between approximately 2 µm and approximately 30 µm.

In another exemplary embodiment of the present disclosure, a target marking method includes associating an emitter with a manned vehicle, the emitter includes at least one quantum cascade laser. Such a method also includes transporting the emitter, via the vehicle, from a first location to a second location different than the first location, and emitting a first thermal beam with the at least one quantum cascade laser, the first thermal beam having a wavelength between approximately 2 µm and approximately 30 µm. The method also includes impinging the first thermal beam on a target, thereby forming a thermal designation on the target.

In a further exemplary embodiment of the present disclosure, a system for use in identifying a manned vehicle includes an emitter associated with the manned vehicle. The emitter includes at least one quantum cascade laser, and emitts a beam having a wavelength between approximately 2 µm and approximately 30 µm. The beam is detectable to identify the manned vehicle as friendly at a distance from the emitter greater than approximately 1 meter.

In still another exemplary embodiment of the present disclosure, a system for use in marking a target includes an emitter associated with a manned vehicle. The emitter includes a quantum cascade laser configured to impinge a thermal beam upon the target in response to a command, thereby forming a thermal designation on the target. The thermal beam has a wavelength between approximately 2 µm and approximately 30 µm.

In a further exemplary embodiment of the present disclosure, a system for use in identifying a user includes an emitter configured to be associated with a helmet of the user, a firearm of the user, or worn by the user. The emitter includes a quantum cascade laser configured to emit a thermal beam identifying a location of the user in response to a command. The thermal beam has a wavelength between approximately 2 µm and approximately 30 µm.

BRIEF DESCRIPTION OF THE SEVERAL VIEWS OF THE DRAWING(S)

DETAILED DESCRIPTION OF THE INVENTION

Figure 1:
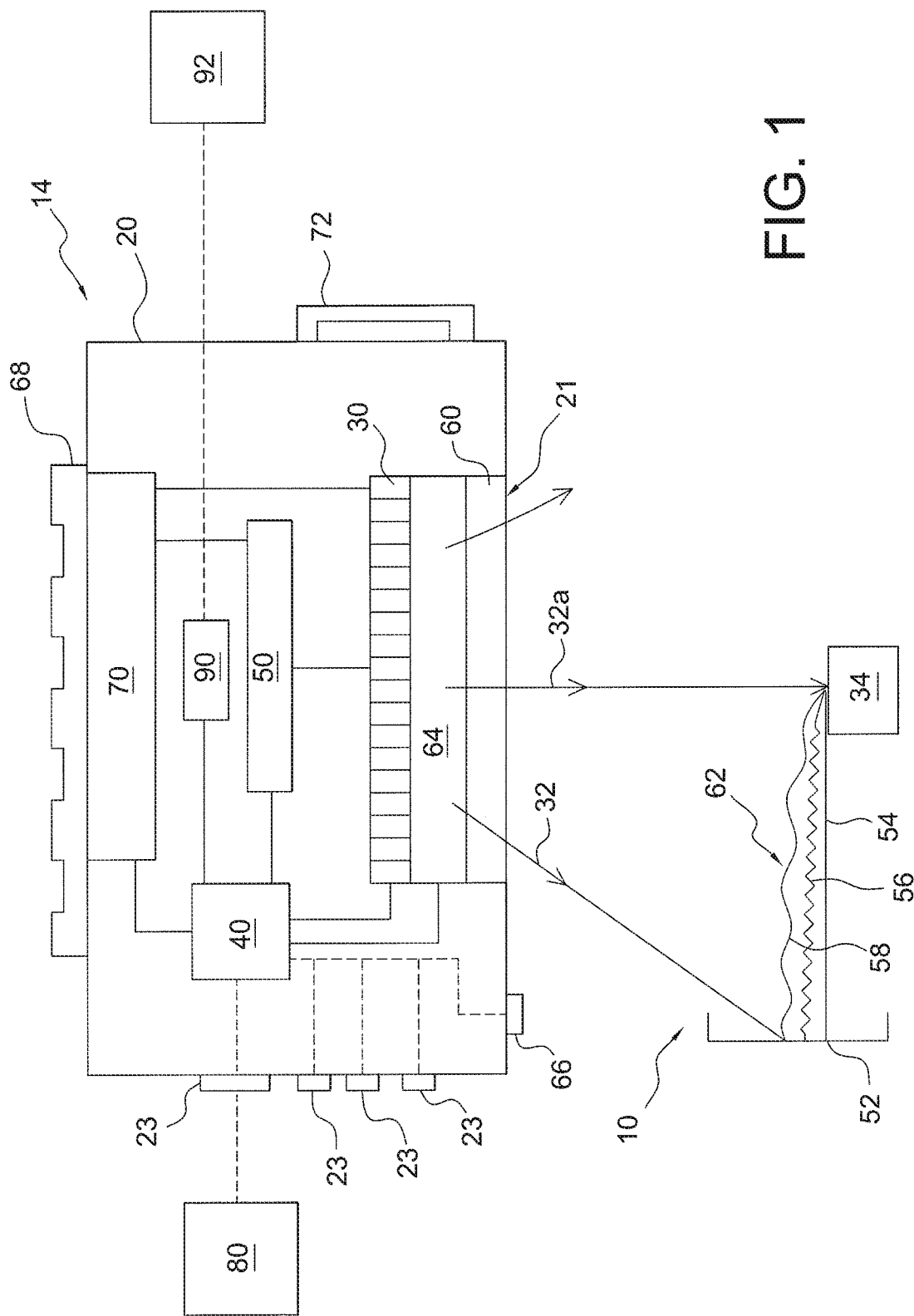
FIG. 1 is a schematic view of a system including an emitter according to an exemplary embodiment of the present disclosure.

FIG. 1 illustrates a system 10 including an emitter 14 according to an exemplary embodiment of the present disclosure. The emitter 14 may emit radiation in the optical portion of spectrum or in the thermal band. Such radiation may be a continuous wave, a temporally modulated beam, or a temporally encoded signal, wherein the temporally encoded signal can be encrypted or unencrypted. Thus the emitter 14 may be, for example, any type of signal emitter capable of selectively emitting one or more thermal or optical beams, pulses, signals, waves, and/or other radiation types (hereinafter "thermal beam(s)," "optical beam(s)," or collectively "beam(s)"). Such an optical beam may have a wavelength between approximately 0.3 µm and approximately 2 µm, and such a thermal beam may have a wavelength between approximately 2 µm and approximately 30 µm.

In an exemplary embodiment, the emitter 14 may emit a thermal beam between approximately 2 µm and approximately 30 µm, and the beam may be detected within a range of approximately 4 km or greater. In additional exemplary embodiments, the beam may be detected within a range of approximately 1 meter or greater. As shown in FIG. 1, such an exemplary emitter 14 may comprise a quantum cascade laser ("QCL") 30 or other beam source known in the art. The emitter 14 may also include a housing 20, a driver 40, a cooler 50, a lens 60, zoom components 64, a communicator 90, and a power supply 70.

The housing 20 can be configured for handheld use, firearm mounting, or mounting to any of the manned vehicles discussed herein. The housing 20 may also be configured for use and/or mounting to any unmanned device or vehicle known in the art. It is understood that any of the manned vehicles described herein, such as those illustrated in FIGS. 3-7, may be programmed, computer and/or remotely controlled, and/or otherwise configured for unmanned use/operation. The housing 20 is selected to encompass at least one of the QCL 30, the driver 40, the cooler 50, the lens 60, the zoom components 64, the communicator 90, and/or the power supply 70. In one configuration, the housing 20 may encompass and/or retain all of the components required for operation of the QCL 30. That is, the housing 20 provides the emitter 14 as a self-contained, handheld, and/or otherwise portable device.

The housing 20 may include an aperture 21 for emission of a beam from the QCL 30. In addition, the housing 20 can include one or more apertures, switches, connectors, or ports 23 for controlling, activating, deactivating, and/or powering the emitter 14. The ports 23 may comprise, for example, an on/off switch, switches or controls for selecting one or more operating modes of the QCL 30, switches or controls for selecting one or more power settings for the QCL 30, and/or power connectors configured to assist in connecting the emitter 14 to a power supply 80 of the manned device to which the emitter 14 is connected. Each of the ports 23 may be connected to the driver 40 through any known electrical connection such that power, control commands, or other signals may be communicated from the ports 23 to the driver 40.

In an exemplary embodiment, such ports 23 may facilitate remote activation, deactivation, control, and/or operation of the emitter 14. As will be described in greater detail below with regard to the communicator 90, the emitter 14 may further include any combination of transmitters, antennas, power circuits, receivers, and/or other known communication components to facilitate such remote activation, deactivation, control, and/or operation.

The ports 23 and/or remote communication components may also assist in, for example, conserving stored energy of the power supply 70. For example, the emitter 14 may be configured to operate in a relatively low current, voltage, and/or power setting until one or more of the above ports 23 and/or communication components receives a "change power setting" signal. In an exemplary low power setting, the driver 40 may direct approximately 2 W or less to the QCL 30, and in such a low power setting, radiation emitted by the QCL 30 may be detectable within a range of approximately 600 meters. Such an exemplary low power setting may correspond to the approximate range of a firearm such as, for example, a rifle or other weapon commonly used in security, law enforcement, self-defense, and/or military operations.

Upon receipt of an exemplary "change power setting" signal, the driver 40, QCL 30, and/or other emitter components may, for example, change from a low power setting to a higher power setting. Such a higher power setting may, for example, increase the current, voltage, and/or power sent to the QCL 30. In an exemplary high power setting, the driver 40 may direct approximately 2 W or more to the QCL 30, and in such a high power setting, radiation emitted by the QCL 30 may be viewable within a range between approximately 600 meters and approximately 10 kilometers. Such an exemplary viewable range may be increased depending on, for example, the optical components and/or power supply employed by the emitter 14. Although described herein as functioning to increase the power sent to the QCL 30, in additional exemplary embodiments, the "change power setting" signal may assist in decreasing the power sent to the QCL 30, thereby changing operation of the QCL 30 from the high power setting to the low power setting. In exemplary embodiments in which at least one of the ports 23 comprises a switch or control for selecting one or more power settings for the QCL 30, the power setting of the driver 40 and/or the QCL 30 may be manually controlled via such a port 23.

The housing 20 can be formed of any of a variety of rigid material such as composites, laminates, plastics or metals. In one configuration, the housing 20 may be formed of an extruded aluminum, thereby providing sufficient strength without requiring significant weight. However, it is understood the housing 20 can be machined such as by EDM (electrical discharge machining) or molding if composites, laminates, plastics or even metals are employed for the housing 20. The housing 20 may be substantially watertight so as to protect the components disposed therein from water or other harmful contaminants found in rugged environments such as combat arenas.

In one configuration of the emitter 14, the housing 20 may be configured to mount to any of a variety of handheld, side, and small firearms. Such firearms include, but are not limited to, pistols, rifles, shotguns, automatic arms, semi-automatic arms, and bows. For example, the housing 20 may be configured to mount to any known sidearm, as well as any known mounted and/or dismounted weapon, such as a dismounted crew-served weapon, such as machine guns and the like. The housing 20 can interface with any of a variety of clamping or mounting mechanisms such as a Weaver-style Picatinny rail or dove tail engagement for mounting to these firearms. The housing 20 of the emitter 14 may include any number of clamps, mounts 68, brackets, 72, and/or other like components to facilitate mounting, connecting, and/or otherwise associating the emitter 14 with such firearms.

Alternatively, as discussed above, the housing 20 may be configured to mount to any of a variety of manned devices used in surveillance, law enforcement, reconnaissance, target marking, friendly force marking, friend or foe identification, or combat applications. As illustrated more clearly in FIGS. 3-7, such manned devices include, but are not limited to, any of a variety of aerial vehicles 18, ground vehicles 22, aqueous and/or sub-aqueous vehicles 24 and amphibious vehicles. Any of the clamps, mounts 68, brackets, 72, and/or other like components of the housing 20 may facilitate mounting, connecting, and/or otherwise associating the emitter 14 with such vehicles. One or more of these components may also be configured to assist in connecting the housing 20 to, for example, a combat helmet, belt, strap, vest, and/or other like article worn by a user thereof. In additional exemplary embodiments, any and/or all components of the emitter 14 may be integrally incorporated into the vehicles with which the emitter 14 is associated. In such embodiments, the housing 20, or portions thereof, may be omitted if desired. For example, in an embodiment in which the emitter 14 is formed integrally with an aerial vehicle 18, ground vehicle 22, aqueous and/or sub-aqueous vehicle 24, or other like vehicle, the components of the emitter 14 may be hermetically sealed within such vehicles, and the housing 20 may be omitted to reduce size, weight, space, power consumption, and/or drag associated with the emitter 14. In such embodiments, one or more windows, lenses, domes, or other components may be employed proximate an outer surface of the vehicle to facilitate emission of one or more beams from the integral emitter components. Using an emitter 14 in an underwater environment may require adjustment of the spectral band in which the emitter 14 operates. Further examples of integrally incorporating the emitter 14 into the vehicles with which the emitter 14 is associated will be described in greater detail below.

With continued reference to FIG. 1, the QCL 30 is retained within and/or otherwise connected to or associated with the housing 20. The QCL 30 may be configured, via the lens 60, to produce a beam extending along a beam path. It is understood that any of a variety of lenses 60, zoom components 64, windows, domes, diffraction gratings, filters, prisms, mirrors, and/or other like optical components, mechanical components, or combinations thereof, may be disposed optically downstream of the QCL 30 along and/or within the beam path. Due to their position along and/or within the beam path, and optically downstream of the QCL 30, beams emitted by the QCL 30 may pass through, be shaped by, and/or otherwise optically interact with such optical components and/or zoom components 64 before exiting the housing 20. The beam path may extend from the QCL 30, through a portion of the housing 20, to pass to the exterior of the housing 20. In an exemplary embodiment, one or more lenses 60 of the type described herein may be positioned in the beam path and optically upstream of a window, dome, or other like optical component.

In an exemplary embodiment, the zoom components 64 may comprise any combination of lenses, beam shaping optics, and/or other known optical components configured to assist in varying the divergence of the emitted beam. In an exemplary embodiment, such optical components may comprise one or more diverging lenses, semi-collimating lenses, mirrors, and/or other like optical device. In addition, the zoom components 64 may comprise one or more tracks, slides, frames, motors, gears, servos, and/or other like mechanical/electromechanical components configured to assist in moving such optical components and/or the QCL 30 relative to each other. For example, the zoom components 64 may be configured to move the QCL 30 along the beam path relative to the lens 60, additional zoom component lenses or optical devices, and/or a window disposed optically downstream of the QCL 30. Such a configuration may facilitate desirably varying the divergence of the emitted beam while maintaining an appropriate hermetically sealed environment within the housing 20.

Alternatively, the zoom components 64 may facilitate movement of the lens 60 and/or additional zoom component lenses or optical devices, relative to the QCL 30. In such an exemplary embodiment one or more of the windows, domes, and/or other optical components may be disposed optically downstream of the QCL 30 and the moveable optical components to facilitate maintaining an appropriate hermetically sealed environment within the housing 20. The zoom components 64 may be configured to enable divergence of the emitted beam between, for example, approximately 3200 milliradians and approximately 0.5 milliradians. In exemplary embodiments, the zoom components 64 may comprise more than one lens to achieve such a broad range of divergence, while in other exemplary embodiments, the zoom components 64 may comprise a rapidly rotating mirror and/or a beam splitter to achieve such divergence range.

In an exemplary embodiment comprising the zoom components 64 described herein, the emitter 14 may further comprise one or more controls 66 operably connected to such zoom components 64 and configured to facilitate manual adjustment of the zoom components 64. For example, the zoom controls 66 may comprise one or more switches, knobs, slides, or other like devices facilitating desired relative movement between the QCL 30 and one or more of the lenses and/or other zoom components 64 described above. The zoom controls 66 may also be operably connected to the driver 40 to facilitate such controlled movement. It is understood that the QCL 30, the lens 60, and/or the one or more zoom component lenses may be mounted to any known guides, tracks, and/or other alignment devices, and such alignment devices may be connected to one or more electric motors or the like to facilitate the relative movement described herein. Such relative movement may result in a corresponding widening or narrowing of the emitted beam cone angle.

In addition, varying the divergence of the emitted beam in this way may impact the power requirements of the QCL 30 and/or the viewability of the emitted beam in a given application. For example, narrowing the cone angle of the emitted beam may increase the distance from the emitter 14 at which the emitted beam may be detected by an appropriate thermal imager. As a result, narrowing the cone angle may enable the user to increase the detectability and/or effective range of the emitter 14 without increasing the power directed to the QCL 30.

One or more of the alignment devices described above, or like additional alignment devices, may also be provided and/or otherwise configured to assist in moving at least one component and/or at least a portion of the emitter 14 relative to a vehicle to which the emitter 14 is mounted. For example, the emitter 14 may be amiably mounted to one of the vehicles described herein. In such embodiments, one or more electric motors and/or other like actuation devices may be associated with the vehicle and/or the emitter 14 to assist in moving at least a portion of the emitter 14 relative to the vehicle. Such movement may assist in aiming the emitter 14, and/or various components thereof, in the direction of a target 34 for impingement of a beam thereon. Such movement may comprise, for example, linear movement, rotation, pivoting, and/or the like motion of the emitter 14 itself and/or one or more components thereof, about one or more axes.

In still further exemplary embodiments, the emitter 14 may be permanently or removably mounted to a support structure, and the emitter 14 may be moveable relative to the support structure for any of the aiming operations describe herein. For example, one or more electric motors and/or other like actuation devices may be associated with the support structure and/or the emitter 14 to assist in moving at least a portion of the emitter 14 relative to the support structure. In such exemplary embodiments, the support structure may comprise an immobile and/or stationary support structure 26, such as a building, a bridge, a tower, a post, and/or other like structures described in further detail below with respect to FIG. 6. In further exemplary embodiments, such a support structure may comprise a tripod and/or other like structure that can be positioned and/or repositioned as desired during use. In still further exemplary embodiments, such a support structure may comprise one or more brackets, ports, mounts, cradles, holders, and/or other like structures formed integrally with and/or mounted to a vehicle with which the emitter 14 is used. In such embodiments, the emitter 14 may be fixedly or removably mounted to such a support structure. In addition to the actuation devices described herein, such support structures may include one or more of the guides, tracks, and/or other alignment devices described above to assist in moving at least a portion of the emitter 14 relative to the support structure. In exemplary embodiments in which the support structure is formed integrally with and/or mounted to a vehicle, moving at least a portion of the emitter 14 relative to the support structure may comprise moving at least a portion of the emitter 14, and/or the emitter 14 itself, relative to the vehicle. Such movement may be performed manually and/or using any of the actuation devices described herein. As described above, such relative movement may assist in, for example, aiming a beam emitted by the emitter 14 during use.

It is further understood that the actuation devices described herein may be activated and/or operated in response to one or more signals indicative of a location of the target 34. For example, the thermal imager 52 and/or one or more sensors associated with the vehicles and/or systems described herein may be configured to determine a position and/or location of the target 34. Such signals may be directed to the emitter 14 and/or to one or more system controllers. The actuation devices may aim and/or otherwise move the emitter 14, and/or portions or components thereof, to point and/or otherwise aim the emitter 14 in the direction of the location, in response to such signals. In such exemplary embodiments, the emitter 14 may be configured to emit one or more beams in response to such signals.

Figure 2:
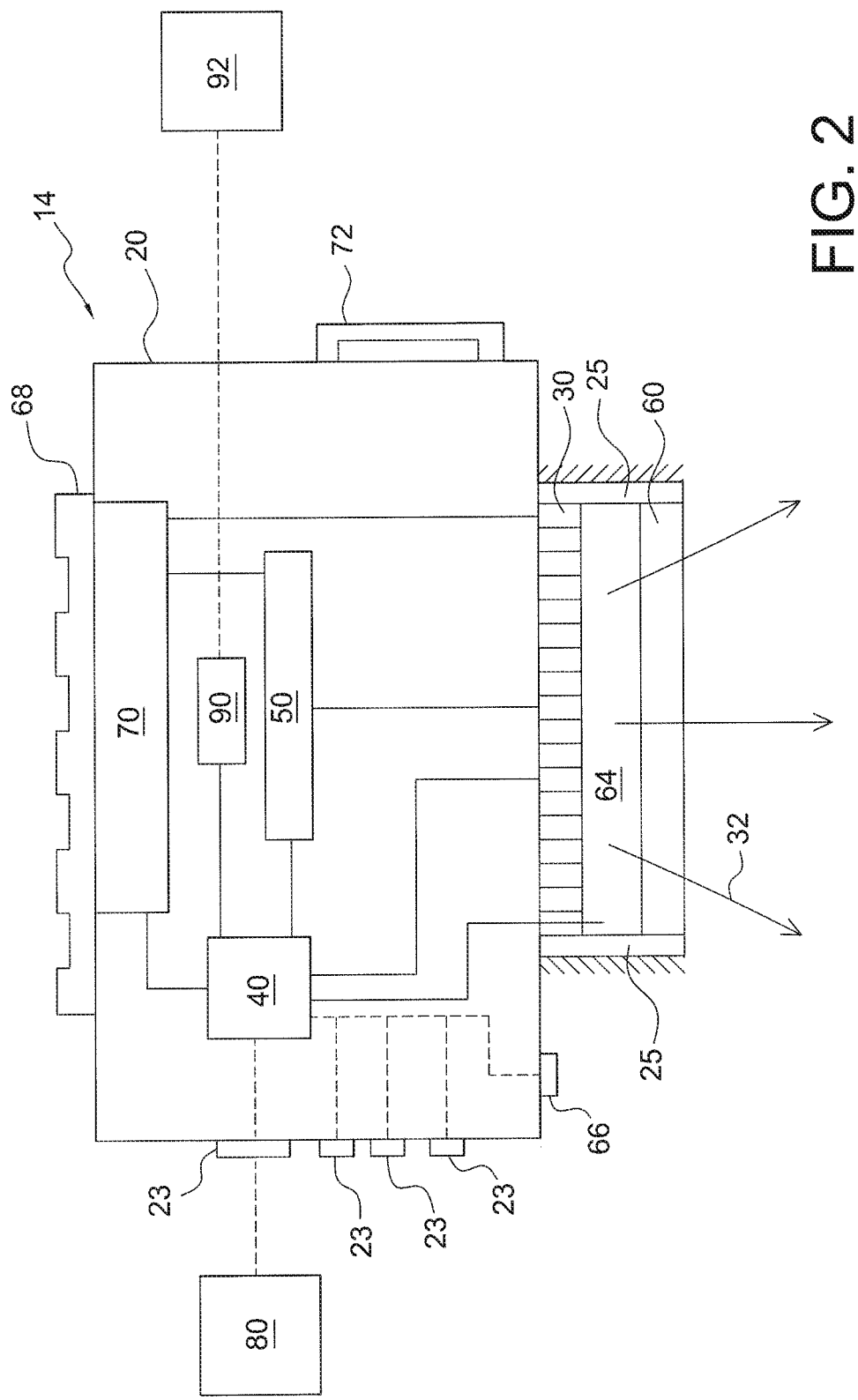
FIG. 2 is a schematic view of an emitter according to another exemplary embodiment of the present disclosure.

It is understood that the QCL 30 and/or the lens 60 may be disposed at a portion of the housing 20 configured to assist with cooling the QCL 30 during operation. For example, as shown in FIG. 2, the housing 20 may define one or more extensions 25 or other like structures configured to assist in cooling the QCL 30 through, for example, contact with moving air, and such an embodiment may be useful when connecting the emitter 14 to, for example, a relatively fast moving vehicle such as an aerial vehicle 18 and/or a ground vehicle 22. Such an extension 25 may be thermally connected to the QCL 30 and may further include, for example, one or more passive cooling devices such as heat sinks, fins, phase change material, or other like devices also thermally connected to the QCL 30. In still another exemplary embodiment, the lens 60 may be omitted, and the beam produced by the QCL 30 may be widely divergent based on the nature and configuration of the QCL 30 itself. It is understood that regardless of the housing configuration, and notwithstanding the presence or omission of the lens 60, window, dome, or other like structure, the QCL 30 may be maintained in a hermetically sealed environment during use.

The QCL 30 may be selected to operate in ambient temperature conditions while producing a beam having a wavelength between approximately 1 µm and approximately 30 µm, with a preferred wavelength of approximately 2 µm to approximately 5 µm or approximately 7 µm to approximately 30 µm. Although a single QCL 30 is shown in housing 20, it is contemplated that a plurality of QCLs can be disposed within the housing 20, some or all of the QCLs emitting beams at different respective wavelengths. In additional exemplary embodiments, a single QCL 30 can be employed with an appropriate driver 40 and/or filter to provide a plurality of corresponding wavelengths.

The QCL 30 may exhibit the electrical behavior of a semiconductor material which can be described with the band model. This model states that various energy ranges, or energy bands, are available to the electrons of the semiconductor material, and that the electrons of the semiconductor material can essentially take on any energy value within the energy bands. Various bands can be separated from one another by a band gap, i.e., an energy band with energy values the electrons cannot possess. If an electron changes from a higher energy band to a lower energy band, energy corresponding to the difference of the energy values of the electron before and after the change, which is also called "transition", is released. The energy difference can be released in form of photons. The band with the highest bound-state energy level, which is fully filled with electrons at a temperature of 0° Kelvin, i.e., the so-called valence band, and the conduction band that is energetically above the valence band, which is unfilled at 0° Kelvin, as well as the band gap between them are of special significance for a semiconductor material.

In the cascades of QCLs, the semiconductor materials for the barrier layers and the quantum wells are selected such that the lower conduction band edge of the barrier material lies higher in energy than the lower conduction band edge of the quantum well material. The lower conduction band edge represents the lowest energy value that an electron can assume within the conduction band. The energy difference between the energy of the lower conduction band edge of the barrier material and the lower conduction band edge of the quantum well material is also called the conduction band discontinuity. As a result of this selection, the electrons of the quantum wells cannot readily penetrate the barrier layers and are therefore enclosed in the quantum wells. The electrons can only "tunnel" through a barrier layer into an adjacent quantum well in a quantum-mechanical process, with the probability of the occurrence of a tunneling process depending on the height of the conduction band discontinuity and the thickness of the barrier layer between the two quantum wells.

In the quantum well, the behavior of the electrons enclosed in the well is determined by quantum mechanics effects due to the small thickness of the layer (only a few nanometers). An essential effect is that the electrons in an energy band of the quantum well can no longer assume any energy value within the energy range of the band, but rather are confined to the energy values of specific energy levels, i.e., sub-bands. The energetic differences between the individual sub-bands are particularly high if the quantum well is very thin and the conduction band discontinuity is high. The electron energy does not change continuously, but rather jumps from one sub-band to the next. The electron can change from one energy level to the other energy level only if the energy increase or the energy decrease suffered by an electron corresponds precisely to the difference of the energy values of two sub-bands. Transitions from one energy level to another energy level within one and the same band are called intersubband transitions. In the cascades of the QCL, the emission of laser radiation occurs at these intersubband transitions. For emission of beams having wavelengths between approximately 2.9 µm and 5.3 µm at room temperature, the QCL 30 as set forth in U.S. Publication No. 2005/0213627, published Sep. 29, 2005, assigned U.S. patent application Ser. No. 11/061,727, filed Feb. 22, 2005, is hereby expressly incorporated by reference.

In one configuration, the QCL 30 or other beam sources of the present disclosure may be hermetically sealed within the housing 20, thereby providing a controlled humidity and atmosphere for operation of the QCL 30. Such hermetic sealing can include a subhousing or potting of the QCL 30. The sealing can include a sealing of the housing 20, a sealing of the QCL 30 as the QCL 30 is retained within the housing 20, or both.

In a further exemplary embodiment, the beam source of the emitter 14 may comprise an infrared laser (such as at 830 nm) and/or a visible laser (400 nm to 750 nm), such as a model HL6321MG laser manufactured by Hitachi. In such exemplary embodiments, the QCL 30 may be omitted. It is further understood that the QCL 30 may be replaced with one or more carbon dioxide lasers. Such lasers may be useful in any of the applications discussed herein, and may be particularly useful in conjunction with any of the marking devices discussed herein.

In a further configuration, the QCL 30 can be tuned to provide a beam of a specific wavelength, and/or to provide a beam having a pulse or other signature easily recognizable by U.S. or other friendly/allied forces. Tuning of the beam emitted by the QCL 30 can be accomplished by locating a grating in the beam path. The grating can be adjustable to allow selective transmission of a given wavelength, or fixed to transmit only a single wavelength. Although the signature of the beam emitted by the QCL 30 may be preset, the wavelength, frequency, pulse rate/pattern, and/or other identifiable and distinguishable characteristics of the beam may be easily tunable in the field and/or during use. Such ease of tunability may substantially reduce or eliminate, for example, the ability of enemy forces to disguise foe emitters as friendly emitters 14. In addition to the grating discussed above, it is understood that the driver 40 may be configured to assist in tuning and/or otherwise controlling the output of the QCL 30.

The driver 40 can be constructed to provide either pulsed or continuous wave operation of the QCL 30. The rise/fall time of the pulse, compliance voltage and current for the QCL are selected to minimize power consumption and heat generation. These parameters may also be selected to produce a desirable beam signature for friend or foe identification. The driver 40 may be located within the housing 20, and may be operably connected to the QCL 30, the cooler 50, and/or the power supply 70. Alternatively, the power supply 70 may be omitted and the driver 40 may be operably connected to a power supply 80 of the device to which the emitter 14 is connected. The driver 40 may include a pulse generator, an amplifier, a pulse switcher, and/or other known driver components.

The driver 40 may enable operation of the QCL 30 as a pulsed laser, such as by passive, active, or controlled switching. Although specific values depend upon the particular QCL 30 and intended operating parameters, it is contemplated the peak power draw of the driver 40 may be on the order of amps, or tens of amps, or more, resulting a substantial power consumption as well as heat generation. Accordingly, in an exemplary embodiment it may be desirable to omit the power supply 70 of the emitter 14, and instead, utilize the power supply 80 of the manned vehicle with which the emitter 14 is associated.

In such exemplary embodiments, the emitter 14 may be configured to interface with the power supply 80 of the vehicle via one or more cords, cables, wireless connections, ports, plugs, docks, cradles, and/or any other known electrical connection devices. In such embodiments, such electrical connection devices may be resident in and/or on the vehicle. At least a portion of such connection devices may also be resident on and/or may extend from the emitter 14. For example, the emitter 14 may include one or more cables configured to mate with a power outlet, cigarette lighter input, and/or any other known power receptacles of the vehicle. Through such connection devices, power may be provided to the emitter 14 from the power supply 80 of the vehicle. It is understood that such electrical connection devices may allow for quick connection and/or disconnection between the power source 80 and the emitter 14.

In an exemplary embodiment, the driver 40 may assist in controlling and/or modifying the power level of the QCL 30 to aid in penetrating components or conditions of the atmosphere in which the emitter 14 is used. Such components or conditions may include, for example, snow, rain, fog, smoke, mist, clouds, wind, dust, gas, sand, and/or other known atmospheric or airborne components. For example, the driver 40 may be configured to controllably, manually, and/or automatically increase the current and/or voltage directed to the QCL 30 to strengthen and/or intensify the beam emitted by the QCL 30 in such conditions. It is also understood that the emitter 14 may comprise at least one midrange QCL and at least one long range QCL to ensure satisfactory operation in such conditions. In still further exemplary embodiments, the emitter may include a plurality of beam sources, and such beam sources may comprise any desired combination of the QCLs 30, lasers, and/or other beam sources described herein. In such exemplary embodiments, the emitter 14 may comprise a fusion device, and the wavelength, frequency, pulse rate, encoding, power settings, and/or other distinguishable and/or observable characteristics of the beams emitted by such beam sources may be controlled individually using the ports 23, zoom controls 66, communicator 90, driver 40, and/or other components of the emitter 14.

In an exemplary embodiment, the QCL 30 may be pulsed at frequencies less than a millisecond. However, it is understood that, depending upon the intended use and range of the emitter 14, the pulse rate, peak power, wavelength, and/or other distinguishable characteristics of the QCL output can be factory set or programmable/modifiable in the field as needed.

The lens 60 may be disposed in the beam path 32 such that in one configuration, the lens 60 is retained substantially within the housing 20. However, it is contemplated the lens 60 can form an interface between the interior and the exterior of the housing 20. In still another exemplary embodiment, a window, the lens 60, and/or the QCL 30 may be disposed in an extension 25 of the housing 20 configured to assist in cooling the QCL 30. As discussed above, such an embodiment is illustrated in FIG. 2.

The lens 60 can be configured to focus the beam at a particular point, and such focus may be aided by the zoom components 64. Alternatively, the lens 60 may be configured to spread or diverge the beam as broadly as possible to maximize coverage. In still further exemplary embodiments, the lens 60 may be omitted from the emitter 14, and the QCL 30 may be configured as a widely-divergent beam source. In such an embodiment, a window, dome, or other like structure may be employed such that the QCL 30 operates in and/or is otherwise maintained in a hermetically sealed environment. In one or more of these exemplary embodiments, the lens 60 can be a dedicated collimator, thereby collimating the beam along the path 32. The lens 60 may be formed of a material substantially transparent to the wavelength of the beam emitted by the QCL 30.

In an alternative configuration, a diffractive optic (not shown) can be located within the beam path 32 to provide collimation of the beam. That is, the diffractive optic may intersect the beam path 32 such that the beam passes through or reflects off the diffractive optic.

In an exemplary embodiment, the power supply 70 may include at least one battery. Depending upon the anticipated power requirements, available space, and weight restrictions, the batteries can be N-type batteries or AA or AAA batteries. Additionally, a lithium/manganese dioxide battery such as military battery BA-5390/U, manufactured by Ultralife Batteries Inc. of Newark, N.Y. can be used with the emitter 14. It is understood that any type of power supply 70, preferably portable and sufficiently small in size for use with any of the devices discussed herein, can be utilized. The battery-type power supply can be disposable or rechargeable.

The power supply 70 may be located within or external to the housing 20. In one configuration, the housing 20 may include a battery compartment sized to operably retain the power supply 70. The battery compartment can be formed of a weather resistant, resilient material such as plastic, and shaped to include receptacles for receiving one or more batteries or other power storage devices. Further, the battery compartment may be selectively closeable or sealable to prevent environmental migration into the compartment.

The power supply 70 may be operably connected to the driver 40 and can be controlled by or utilized under driver commands. Thus, the amount of power from the power supply 70 can be controlled or varied to alter the output of the QCL 30. As discussed above, however, the emitter 14 and each of its components may also be powered by one or more power supplies 80 of the device and/or vehicle to which the emitter 14 is connected. In such an exemplary embodiment, the power supply 70 may be omitted, and the driver 40 and/or other power distribution devices of the emitter 14 may distribute power from the power supply 80 to the emitter components.

In a further configuration, a cooler 50 can be disposed in thermal contact with the QCL 30. The cooler 50 may be disposed within the housing 20, and may be employed to maintain the QCL 30 at a desirable operating temperature. As certain configurations of the cooler 50 require energy input, it is advantageous that the housing 20, the QCL 30 and the driver 40 be configured to minimize thermal demands on the cooler 50. For example, at least a portion of the QCL 30 may be disposed outside of the housing 20 such that the QCL 30 is at least partially cooled by wind, atmospheric temperature, water, or other aspects of the external environment in which the emitter 14 is used. In an exemplary embodiment, the cooler 50 may assist in cooling the QCL 30 to approximately room temperature or between approximately 65° Fahrenheit and approximately 75° Fahrenheit. In additional exemplary embodiments, the cooler 50 may be configured to cool the QCL 30 to temperatures below room temperature, such as to approximately 32° Fahrenheit or lower. In such exemplary embodiments, one or more barriers, seals, walls, compartments, absorbent materials, and/or other like components may be employed proximate the QCL 30 to assist in isolating the QCL 30 from any condensation or moisture formed on and/or by the cooler 50. Such components may be included within the housing 20, or in alternative exemplary embodiments in which the emitter 14 is formed integrally with the vehicle and at least a portion of the housing 20 has been omitted, such components may also be disposed within and/or formed integrally with the vehicle. For example, a cooling system of the vehicle may be configured to provide coolant to the emitter 14 for the purpose of cooling the emitter 14 during use. For example, the emitter 14 may include one or more fittings, couplings, ports, hoses, passages, valves, and/or other like structures configured to accept coolant from the cooling system of the vehicle and/or to return coolant to the vehicle cooling system. Such structures may be, for example, formed by and/or fluidly connected to the housing 20. Alternatively and/or in addition, such structures may be fluidly connected to the cooler 50. In exemplary embodiments, the cooler 50 may comprise a thermoelectric cooler or any other cooler known in the art.

The cooler 50 can be a passive device or an active device. A passive cooler 50 may comprise a heat sink, a phase change element, a radiator, and/or one or more fins configured to dissipate thermal energy from the QCL 30. As used herein, a "phase change element" may include any element and/or material configured to absorb heat energy and utilize the absorbed energy to change the phase of, for example, a solid to a liquid. An active cooler 50 may comprise a Peltier module, a Stirling device, and/or one or more fans.

In a further exemplary embodiment, the emitter 14 may include a communicator 90 comprising any combination of an antenna, a receiver, a transmitter, and/or a transceiver for receiving information from and/or transmitting information to a remote source 92. As described above, such components may be operably connected to and/or connectable via one or more of the ports 23. Such information can include targeting data, strategic data, signaling data, emission data, operating or control signals, and/or other like data or signals useful in combat, law enforcement, reconnaissance, stealth location, or marking exercises. The communicator 90 may be operably connected to the power supply 70, 80 as well as well as the driver 40. Accordingly, the emitter 14 may be capable of communicating with the remote source 92 via the communicator 90. The communicator 90 and the remote source 92 may be capable of radio and data transmission at wireless frequencies, and/or other communication for the transmission of information, data, control signals, and the like. In an exemplary embodiment, such control signals may include on/off commands as well as control commands for remotely changing the power setting, pulse rate, encryption signature, wavelength, and/or other characteristics of the beam emitted by the QCL 30. It is understood that corresponding functions or operations of the QCL 30 and/or the driver 40 may be changed or controlled in response to such control signals.

In additional exemplary embodiments in which at least one of the ports 23 comprises a switch or control for selecting one or more operating modes of the QCL 30, the user may manually change, for example, the pulse rate, encryption signature, wavelength, and/or other characteristics of the emitted beam via such a port 23. For example, the driver 40 may be pre-programmed to operate the QCL 30 in multiple operating modes, wherein each mode is characterized by a unique pulse rate, and an exemplary mode selector at port 23 may be manipulated by the user to toggle between such modes as desired. In an exemplary embodiment, such modes may comprise a "fast" pulse mode, a "slow" pulse mode, and an "SOS" pulse mode. While operating in such an exemplary fast pulse mode, the QCL 30 may emit a beam having a pulse rate between approximately 4 Hz and approximately 120 Hz. Alternatively, while operating in such an exemplary slow pulse mode, the QCL 30 may emit a beam having a pulse rate between approximately 0.5 Hz and approximately 4 Hz. Additionally, a non-periodic pulse train may be used.

In additional exemplary embodiments, one or more additional mode selectors may be used to select and/or change the encryption signature of the emitted beam. The encryption signature of the beam may comprise various temporal modulation patterns, frequencies, and/or encoding profiles characteristic of the beam. It is understood that such additional mode selectors may also be used to choose from among multiple beam sources of the emitter 14, thereby changing the wavelength of the emitted beam. It is further understood that the pulse rate, encryption signature, wavelength, power setting, and/or other observable characteristics of the beams emitted by each separate beam source may be altered using additional corresponding mode selectors at ports 23.

As shown in FIG. 1, exemplary systems 10 of the present disclosure may also include a thermal imager 52 configured to detect and/or otherwise view reflected radiation 54, re-emitted radiation 56, and/or scattered radiation 58 (referred to collectively as "return radiation 62") resulting from an emitted beam traveling along a beam path 32a and impinging upon the target 34.

The thermal imager 52 may be any device or combination of devices configured to receive such return radiation 62 and to interpret characteristics of the return radiation 62. For example, the thermal imager 52 may comprise a focal plane array such as, for example, a microbolometer array, or other like device. The thermal imager 52 may comprise any type of known pixel array, and such an array may include one or more pixels. Such an array may be cooled or uncooled depending on the desired application. In an additional exemplary embodiment, the thermal imager 52 may comprise a readout integrated circuit or other like component configured to detect a temporally modulated thermal input and produce an enhanced digital output signal based on the detected thermal input.

In an exemplary embodiment, return radiation 62 received by the thermal imager 52 may impinge upon the imager 52, thereby heating a portion of the imager 52 and changing the electrical resistance of the heated portion. This resistance change may be measured and processed by, for example, a readout integrated circuit and/or other components of the imager 52. For example, pixels of the focal plane array may be heat sensitive, and may exhibit a change in resistance when return radiation 62 having a wavelength between approximately 8 μm and approximately 20 μm or longer is incident thereon. This return radiation 62 may be utilized to create an image of, for example, at least a portion of the target 34 impinged upon by the beam emitted by the emitter 14. The emitted beam may form, for example, a thermal designation 36 (FIGS. 3-5 and 7) at the portion of the target 34. The image of the target 34 may be shown on a display associated with the imager 52 so as to be viewable by a user, and the emitted beam may form at least a portion of the image. Such functionality may be useful in, for example, the target marking applications described herein with respect to at least FIGS. 3-7.

It is also understood that, as shown in FIG. 1, an emitted beam traveling along a beam path 32 may impinge directly upon the thermal imager 52. In such embodiments, the thermal imager 52 may be configured to detect and/or display such emitted beams. The imager 52 may also be configured to distinguish such beams as being emitted by friendly or unfriendly forces based on the encryption signature of the emitted beam. Such functionality will be described in greater detail below with respect to at least FIG. 4.

FIGS. 3-7 illustrate exemplary systems 10 for use in friend or foe identification as well as marking a target, location, and/or object. The system 10 may include, for example, among other things, an emitter 14 coupled to and/or otherwise associated with a manned device. In such embodiments, the emitter 14 may be configured to emit a thermal beam identifying the vehicle as friendly and/or to identify the location of the vehicle. In exemplary embodiments in which the emitter 14 is associated with a manned vehicle, the emitter 14 may also be configured to emit one or more thermal beams and to impinge the thermal beams on a target. Such thermal beams may form a thermal designation 36 on the target that is viewable only in the thermal band. In this way, the emitter 14 may be used to emit a thermal beam containing friend or foe identification information, and the thermal beam may also be used to thermally mark a target. It is understood that, in certain situations, the emitter 14 may be used to mark friendly forces, locations, objects, and/or resources. In such situations, the target may be a friendly target such as friendly ground forces or other friendly manned vehicles. It is also understood that in any of the friend or foe identification methods discussed herein, such as, for example, the identification methods described with respect to FIGS. 3-7, any of the mode selection, pulse rate modification, encryption signature modification, wavelength modification, beam divergence, remote operation, and/or other functions or processes discussed above with respect to the emitter 14 may be utilized to assist in friend or foe identification and/or enhance such identification performance. For example, a user may toggle between various modes of the emitter 14, vary the pulse rate of the emitted beam, encrypt the beam and/or alter an encryption signature of the beam, emit beams having one or more different wavelengths, modify a wavelength of an emitted beam, widen or narrow the cone angle of the emitted beam, and/or perform any other function with the emitter 14 useful in assisting with friend or foe identification. It is understood that one or more of the above functions may also be performed during a thermal marking method or operation.

In further exemplary embodiments, the emitter 14 may be associated with and/or otherwise connected to a helmet, vest, belt, rucksack, backpack, and/or other like article worn, transported, or carried by a user. It is understood that the emitter 14 may be permanently connected to such articles or, in additional exemplary embodiments, the emitter may be removably connected to such articles. Alternatively, the emitter 14 may be permanently connected, removably connected, and/or otherwise associated with a firearm carried by the user. In such embodiments, the emitter 14 may be configured to emit a thermal beam identifying the user as friendly and/or to identify the location of the user and/or the article or firearm with which the emitter 14 is associated. In each of the embodiments described herein, the system 10 may include one or more of the thermal imagers 52 discussed above. Such thermal imagers 52 may be associated with the same vehicle with which the emitter 14 is associated. Alternatively and/or in addition, such thermal imagers 52 may comprise goggles or other like devices worn by the user.

As shown in FIGS. 3-7, the emitter 14 can be connected to an aerial vehicle 18, a ground vehicle 22, an aquatic or sub-aquatic vehicle 24, a stationary structure 26, a helmet 27, and/or any of the other devices discussed herein.

Figure 3:
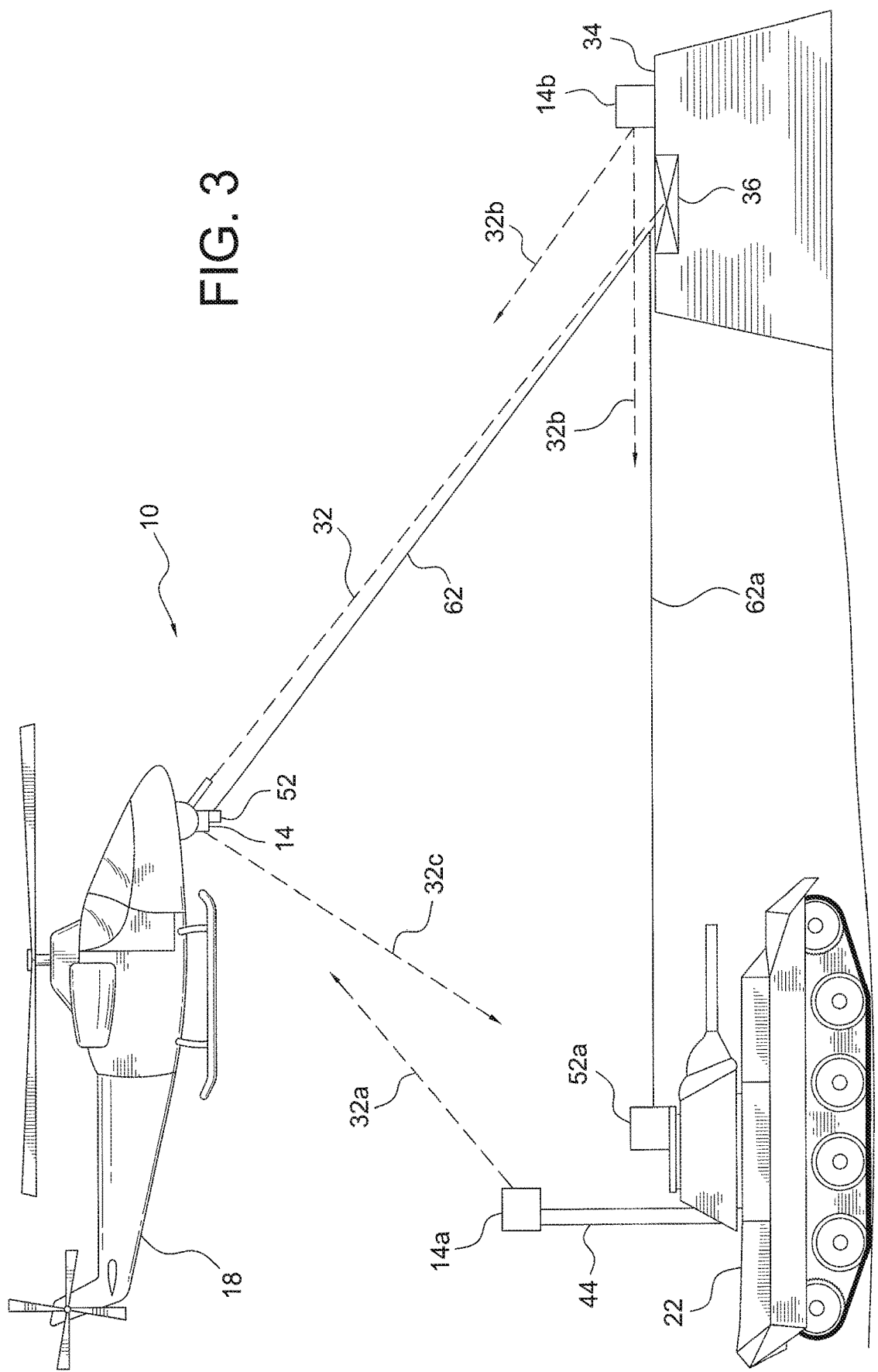
FIG. 3 illustrates a system according to an exemplary embodiment of the present disclosure.

FIG. 3 illustrates an exemplary embodiment of the system 10 in which the emitter 14 has been connected to, formed integral with, and/or otherwise associated with an aerial vehicle 18. The system 10 may also include a thermal imager 52 associated with the aerial vehicle 18. As shown in FIG. 3, during use, the emitter 14 may emit a beam along the beam path 32, and the beam may impinge upon a target 34. The target 34 may be, for example, a substantially stationary target such as, for example, a building or other like object. In additional exemplary embodiments, the target 34 may be a moving or a moveable object. Such targets 34 may comprise, for example, any of the ground vehicles, aerial vehicles, aqueous vehicles, humans, animals, and/or sub-aqueous vehicles described herein, whether stationary or moving.

As the beam impinges upon the target 34, the beam may heat a portion of the target 34, thereby forming a thermal designation 36 thereon. Due to the wavelength, intensity, and/or other characteristics of the beam, the thermal designation 36 may be viewable and/or otherwise detectable for a period of time even after the beam no longer impinges upon the target 34. The length of this period of time may depend upon, for example, the temperature of the target 34, the temperature of the ambient environment, and/or characteristics of the beam described above. In an exemplary embodiment, such a length of time may be, for example, approximately 10 seconds or less. In additional exemplary embodiments, the period of time may be approximately 1 minute or less. In still further exemplary embodiments, the length of time may be greater than 1 minute.

Impinging the beam upon the target 34 may result in return radiation 62 being directed away from the target 34. At least a portion of the return radiation 62 may be detected by the thermal imager 52. In this way, the emitter 14 may be utilized to mark the target 34 as being either friendly or unfriendly, and other friendly forces in the vicinity of the target 34 may take action in response to receipt of such information. For example, as illustrated in FIG. 3, additional friendly forces such as a ground vehicle 22 may also be equipped with one or more thermal imagers 52a. At least a portion of the return radiation 62a may be detected by the thermal imager 52a. In particular, the thermal imager 52 a may be configured to detect and/or otherwise view the thermal designation 36 formed by the emitter 14, and the friendly forces operating the ground vehicle 22 may take action in response to viewing the thermal designation 36. For example, if the thermal designation 36 indicates that the target 34 is an unfriendly target, the ground vehicle 22 may attempt to avoid the target 34 or may engage the target 34 as necessary, depending upon the combat, security, law enforcement, and/or other environment.

It is also understood that the thermal imager 52a may assist in viewing the thermal designation 36 while the thermal imager 52a and/or the ground vehicle 22 is moving relative to the target 34. It is further understood that the thermal imager 52a may assist in viewing the thermal designation 36 while the emitter 14 associated with the aerial vehicle 18 is moving relative to the target 34. In still further exemplary embodiments in which the thermal imager 52 associated with the aerial vehicle 18 is utilized to view the thermal designation 36, movement of the emitter 14, also associated with the aerial vehicle 18, may correspond to movement of the thermal imager 52. Likewise, the thermal imagers 52, 52a described herein may assist in viewing the thermal designation 36 in situations in which the target 34 is moving or stationary relative to the vehicles 22, 18, 24 described herein, or relative to the emitter 14.

In an exemplary embodiment in which the target 34 comprises a human being, or another object generating heat such as, for example, a motor, a reactor, and/or other like devices, the target 34 may be characterized by a temperature greater than room temperature and/or greater than, approximately, 96° F. In such exemplary embodiments, the emitter 14 may be configured to form the thermal designation 36 on the target 34 with relative ease due to the wavelength, intensity, and/or other characteristics of the beam. It is also understood that the divergence, wavelength, power, intensity, and/or other characteristics of the beam may be varied to facilitate such marking. The characteristics of the beam may facilitate distinguishing and/or otherwise resolving the designation 36 from the target 34. For example, the thermal imager 52, may form a visible image of at least a portion of the target 34, such as the portion of the target 34 impinged by the beam. The thermal imager 52 may form such an image using, for example, the radiation 62. Thus, the beam and/or the thermal designation 36 may form a portion of the image. In such a visible image, the beam and/or the thermal designation 36 may be distinguishable from the target 34.

As is also understood with regard to each of the exemplary embodiments discussed herein, two or more friendly vehicles, targets, and/or users may utilize the emitters 14 to communicate with each other in the thermal band and, in particular, to identify each other as friendly. Accordingly, as shown in FIG. 3, an emitter 14b may be disposed on and/or otherwise associated with the target 34. The emitter 14b may be controlled to emit one or more beams along beam paths 32b, and such beams may be detectable by the thermal imagers 52, 52a of the vehicles 18, 22, respectively. If the target 34 is a friendly target, such beams may identify the target 34 as such. On the other hand, if the target 34 is unfriendly, the emitters 14 may have been associated with the target 34 covertly to indicate a location of potential engagement. Moreover, the emitter 14 of the vehicle 18 may emit a beam along path 32c which can be detected by the thermal imager 52a of the ground vehicle 22. Likewise, the emitter 14a of the ground vehicle 22 may emit a beam along path 32a which can be detected by the thermal imager 52 of the aerial vehicle 18. As a result, users of the vehicles 18, 22 may identify themselves to each other as friendly forces.

Figure 4:
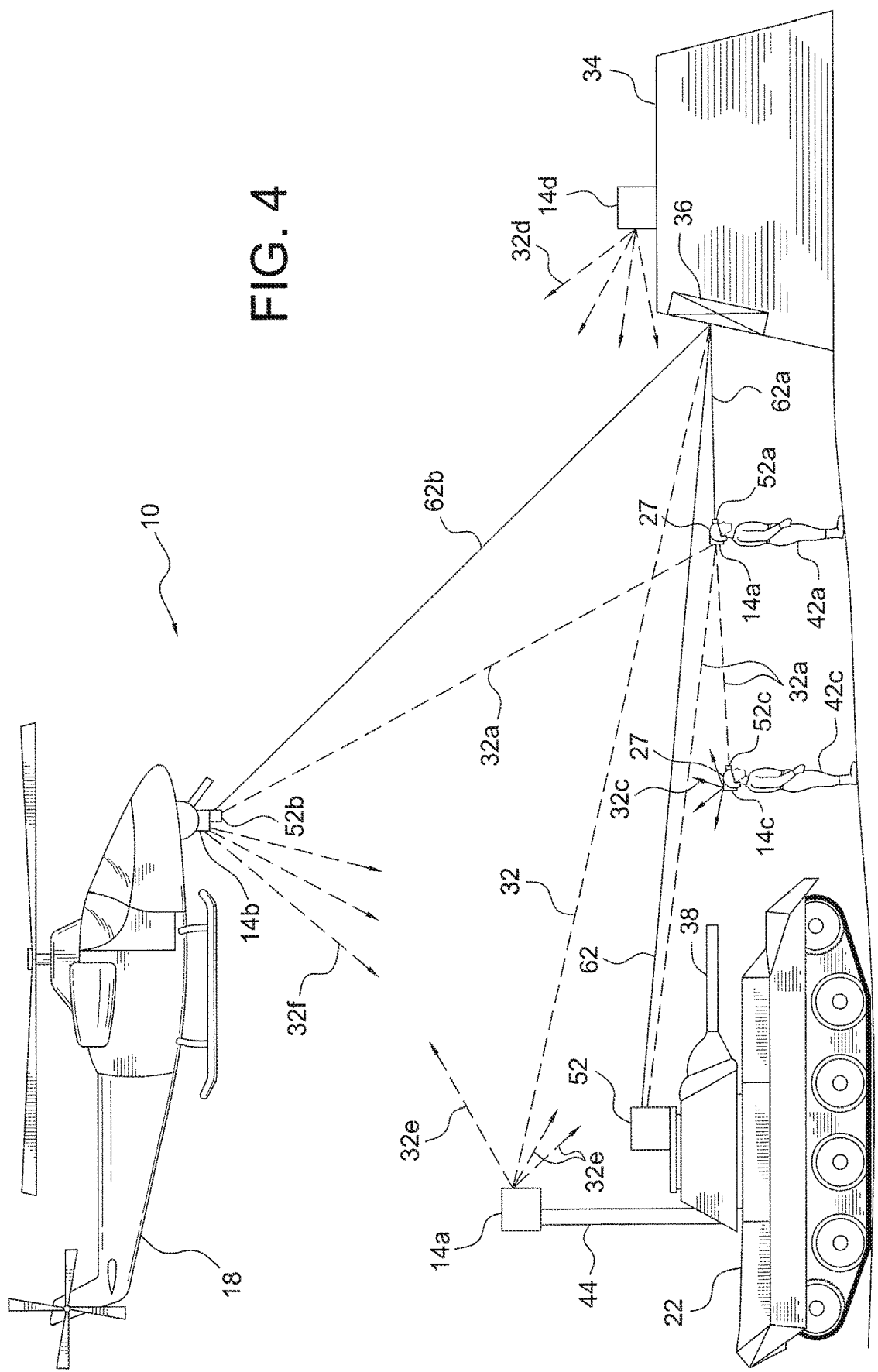
FIG. 4 illustrates a system according to another exemplary embodiment of the present disclosure.

FIG. 4 illustrates a further exemplary embodiment of the system 10. FIG. 4 illustrates an exemplary embodiment in which the ground vehicle 22 utilizes an emitter 14 associated therewith to form the thermal designation 36 on the target 34. The emitter 14 may be mounted to and/or otherwise connected to a mast 44 associated with the ground vehicle 22. Such a mast 44 may assist in increasing, for example, the range and/or aimability of the emitter 14. For example, the emitter 14 may be rotatably, povotably, moveably, and/or otherwise aimably mounted to the mast 44, such that the emitter 14 may be aimed in the direction of the target 34, via the mast 44, to assist in impinging a thermal beam on the target 34. Such a thermal beam may travel along the beam path 32 to form the thermal designation 36. Return radiation 62 may be detected by the thermal imager 52, thereby enabling a user to view the thermal designation 36. In this way, the emitter 14 of the ground vehicle 22 may be utilized to mark the target 34, and additional vehicles and/or other friendly forces in the proximity of the target 34 may be able to view the thermal designation 36 and take action in response to such viewing. For example, the return radiation 62a may be detected by a thermal imager 52a worn by a law enforcement officer, soldier, security officer, and/or other friendly user 42a. In such an exemplary embodiment, the thermal imager 52a may comprise goggles or other like devices worn by the friendly user 42a. Upon viewing the thermal designation 36, the friendly user 42 may, for example, avoid the target 34 or engage the target 34 depending upon the circumstances.

As is also shown in FIG. 4, return radiation 62b may be detected by a thermal imager 52b associated with one or more aerial vehicles 18. Upon viewing the thermal designation 36 and/or the return radiation 62b, users of the aerial vehicle 18 may take similar action in response to the viewing, as described above.

In further exemplary embodiments, one or more friendly users 42a may also employ an emitter 14a associated with a helmet 27 and/or other article worn or transported by the friendly user 42a. Such an emitter 14a may generate a beam indicating that the user 42A is a friendly user. As shown in FIG. 4, such a beam may travel along beam path 32a, and may be detected by one or more additional thermal imagers proximate the user 42a, Such thermal imagers may include, for example, a thermal imager 52 associated with one or more ground vehicles 22, a thermal imager 52b associated with one or more aerial vehicles 18, and/or thermal imagers 52c worn by one or more additional friendly users 42c, In this way, the beam emitted by emitter 14a may send information to multiple friendly forces within the range of the emitter 14a, and such information may identify and/or otherwise distinguish the user 42a as a friendly user, Such information may be particularly useful in dangerous environments and/or and environments in which multiple users are operating in close proximity.

For example, upon receiving an emitted beam from the emitter 14a, an additional friendly user 42c may identify, recognize, and/or otherwise distinguish the user 42a as a friendly user, and may not engage the user 42a in response to such viewing and/or identification. As is also illustrated by FIG. 4, the additional user 42c may also be equipped with an emitter 14c configured to operate substantially similarly to the emitter 14a. Accordingly, FIG. 4 illustrates an exemplary embodiment in which multiple emitters 14 may be utilized within a single engagement arena. Some of the emitters 14 may generate a beam useful for friend or foe identification while other emitters 14 may be employed to generate a thermal designation 36 on a target 34. It is understood that a single emitter 14 may be utilized to perform each of the thermal marking, friend or foe identification, and/or other functions described herein. In addition, a single thermal imager 52 may be utilized to view the thermal designation 36 and the emitted beam generated by a friendly emitter 14.

With continued reference to FIG. 4, one or more emitters 14d may be associated with the target 34, and may emit one or more beams along beam paths 32d. Such beams may assist in identifying the target 34 as friendly or unfriendly. Such beams may be detected by any of the thermal imagers 52, 52a, 52b, 52c illustrated in FIG. 4. Likewise, the emitters 14, 14b associated with the ground vehicle 22 and aerial vehicle 18, respectively may emit beams along respective beam paths 32e, 32f, and such beams may be detected by the various thermal imagers 52, 52a, 52b, 52c illustrated in FIG. 4 to identify the recipients of such beams as friendly or unfriendly. In an embodiment in which the target 34 is unfriendly, the emitter 14d may be associated with the target 34 covertly and may be activated and/or controlled remotely using the communicator 90 and/or any other of the components described herein.

Figure 5:
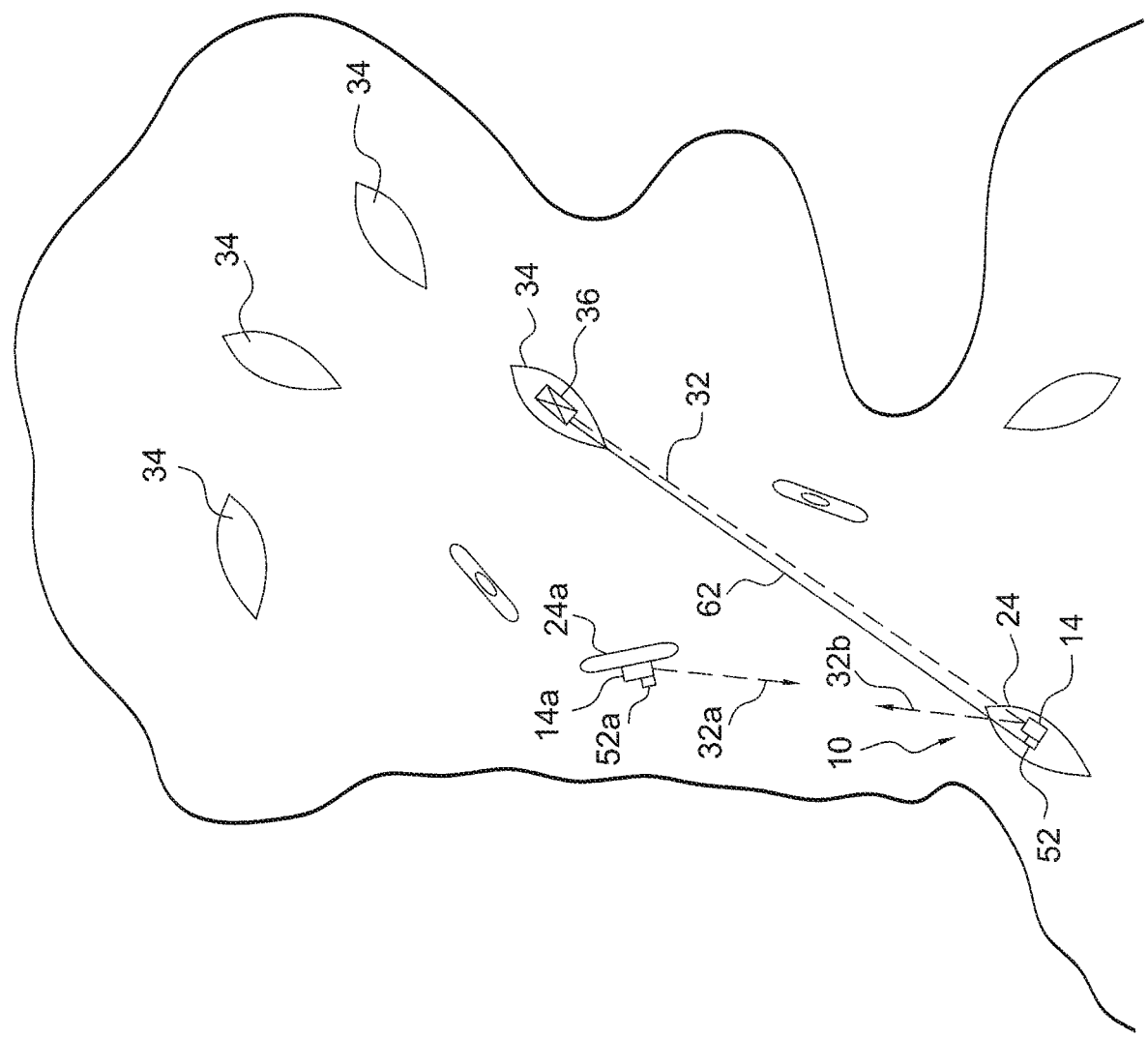
FIG. 5 illustrates a system according to still another exemplary embodiment of the present disclosure.

FIG. 5 illustrates a further exemplary embodiment of the system 10 in which the emitter 14 is associated with an aqueous and/or subaqueous vehicle 24. Such an emitter 14 may be employed to mark a moving target 34 that is selected from a plurality of moving target's 34. In such an exemplary embodiment, the emitter 14 may emit a thermal beam along beam path 32 to generate a thermal designation 36 upon the target 34. Although FIG. 5 illustrates the target 34 as being one of a plurality of aqueous and/or subaqueous vehicles, it is understood that in further exemplary embodiments, such moving target's 34 may comprise, for example, one or more human beings, aerial vehicles 18, and/or ground vehicles 22. As shown in FIG. 5, impinging the beam upon the target 34 may result in return radiation 62 being directed toward a thermal imager 52 associated with the vehicle 24. Upon detecting and/or viewing the designation 36 and/or the return radiation 62, users of the vehicle 24 may take appropriate action in response. For example, such users may engage the target 34 and/or may avoid the target 34 depending upon the situation.

In addition, emitters 14 may be associated with and/or carried by more than one of the vehicles 24 illustrated in FIG. 5. In such an exemplary embodiment, an emitter 14 associated with a first vehicle 24 may emit a beam along a beam path 32b, and a thermal imager 52a associated with a second vehicle 24a may detect the emitted beam and identify the first vehicle as friendly. Likewise, the second vehicle 24a may include an emitter 14a generating a beam along a beam path 32a. A thermal imager 52 associated with the first vehicle 24 may detect the beam emitted by the emitter 14a and may identify and/or recognize the second vehicle 24a as friendly.

Figure 6:
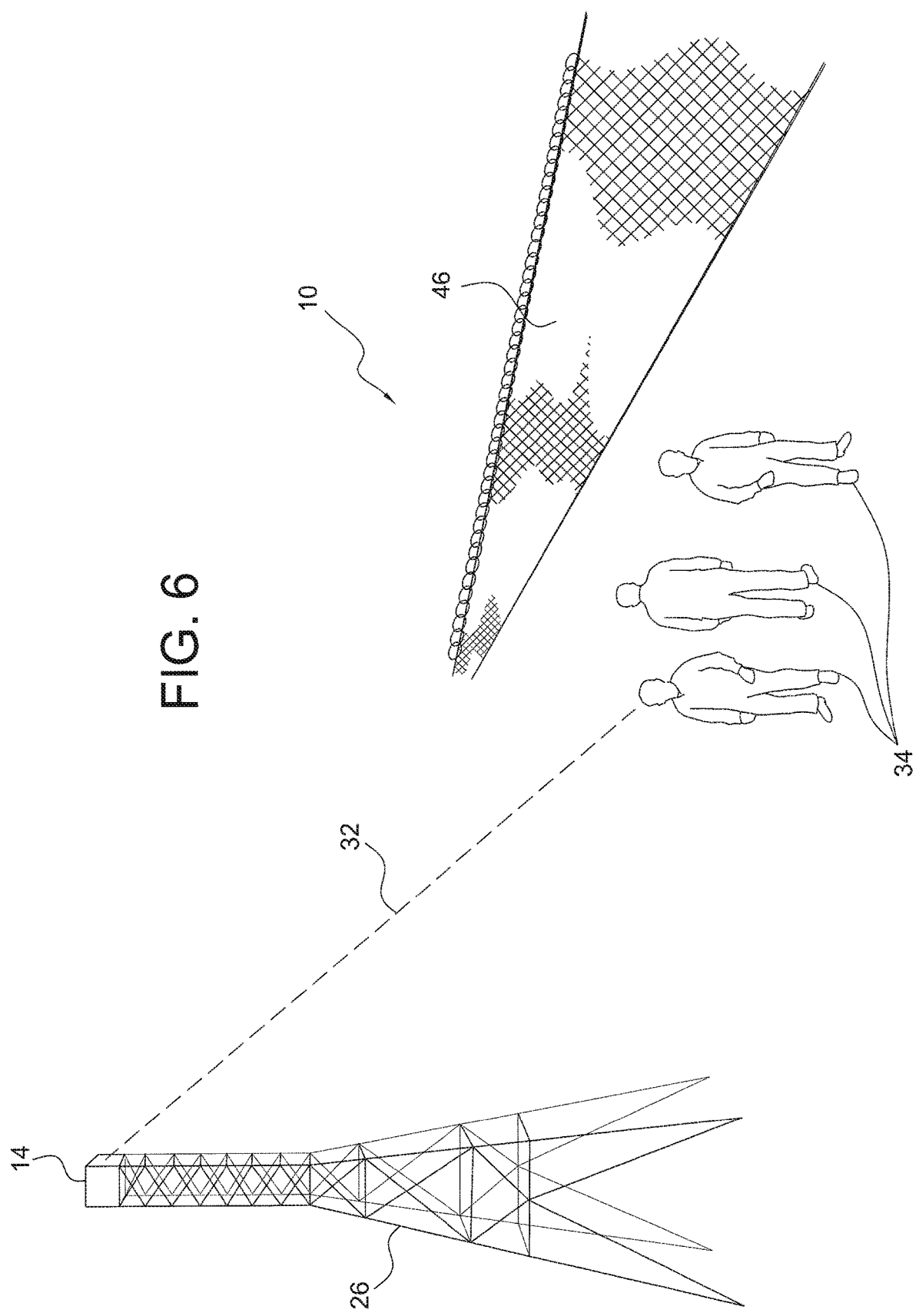
FIG. 6 illustrates a system according to an additional exemplary embodiment of the present disclosure.

FIG. 6 illustrates an exemplary embodiment in which the emitter 14 has been aimably and/or otherwise movably mounted to a substantially stationary structure 26. Such a structure 26 may comprise, for example, a mast, a pole, a tower, a bridge, a building, a tripod, and/or other like object extending a desired distance above ground level. As described above with regard to the mast 44, aimably mounting the emitter 14 to such a structure 26 may facilitate in directing a beam emitted by the emitter 14 in the direction of a target 34. It is understood that in each of the exemplary embodiments described herein, one or more motors, controllers, and/or other like devices configured to assist in aiming the emitter 14 may be utilized to assist in such a mobile and/or amiable mounting. Alternatively and/or in addition, in exemplary embodiments in which the structure 26 comprises a tripod or other like moveable or transportable support, a user may manually aim such an amiably mounted emitter 14. Such user aiming may be accomplished by, for example, manually moving the structure 26 or by manually moving the emitter 14 relative to the structure 26. In an exemplary embodiment, such a structure 26 may be disposed proximate, for example, a border crossing, a security fence, and/or other like boundary 46, region, or secured area. In such an exemplary embodiment, an emitter 14 aimably mounted to such a structure 26 may be utilized to assist in, for example, marking targets 34 attempting to cross such a boundary 46 and/or exit such a secured area. In such an exemplary embodiment, the emitter 14 may be employed to form a thermal designation 36 upon one or more of the targets 34, thereby enabling users of the emitter 14 to take necessary action in response.

Figure 7:
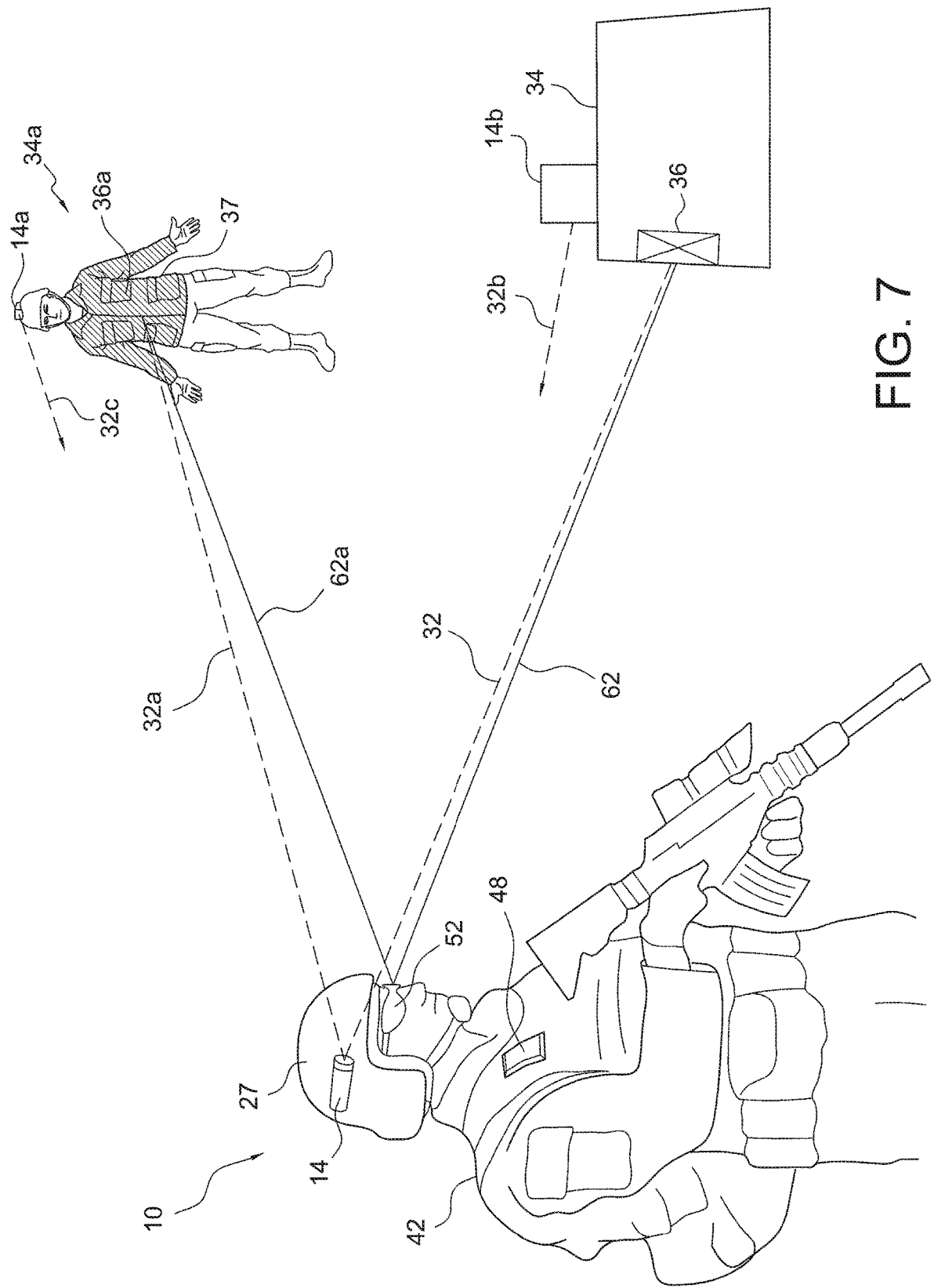
FIG. 7 illustrates a system according to yet another exemplary embodiment of the present disclosure.

FIG. 7 illustrates an exemplary embodiment in which an emitter 14 associated with an article worn by a friendly user 42 may be utilized to mark one or more targets. For example, the emitter 14 may be associated with a helmet 27 worn by the user 42. As a result, a beam emitted by the emitter 14 may be aimed by, for example, head movement by the user 42. The user 42 may also employ one or more triggers 48 controllably and/or otherwise operatively connected to the emitter 14. In an exemplary embodiment, the trigger 48 may be hardwired to the emitter 14. In additional exemplary embodiments, the trigger 48 may communicate with the emitter 14 wirelessly. In such exemplary embodiments, the trigger 48 may be utilized by the friendly user 42 to activate the emitter 14 and/or otherwise control the emitter 14 to emit a beam along beam path 32. In this way, the emitter 14 may be utilized to form a thermal designation 36 on a desired target 34. In still other exemplary embodiments, the trigger 48 may be utilized to control the emitter 14 to generate a beam along beam path 32a. Such a beam may, for example, impinge upon a friendly target 34a, thereby marking the friendly target 34a. Additional users 42 may be able to view a thermal designation 36a formed by such a beam, and may not engage the friendly target 34a in response to such viewing.

As illustrated in FIG. 7, the friendly user 42 may mark the friendly target 34a with a thermal designation 36a by impinging a thermal beam on an article 37 worn by the target 34a. In an exemplary embodiment, such an article 37 may be made from and/or may otherwise comprise a predetermined highly thermally absorbent material. In such an exemplary embodiment, the highly thermally absorbent material may be woven integral with the clothing and/or article. Such materials may be configured to generate a large amount of return radiation 62a, thereby greatly increasing the reviewability and/or detectability of the thermal designation 36a.

In addition, the targets 34, 34a illustrated in FIG. 7 may each include respective emitters 14b, 14a associated therewith. Such emitters 14b, 14a may emit respective beams along respective beam paths 32b, 32c. The thermal imager 52 worn by the user 42 may be capable of detecting such beams, and the user 42 may identify the targets 34, 34a as one of friendly or unfriendly based on the beam and its characteristics. Although not illustrated in FIG. 7, it is understood that the emitter 14 associated with the user 42 may also emit a beam identifying the user 42 as friendly, and the target 34a may detect such a beam for identification purposes utilizing a thermal imager 52 of the type described herein.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

The invention claimed is:

1. A system, comprising:
   a housing;
   a light source disposed within the housing and configured to emit a beam of infrared radiation;
   an optical system optically downstream from the light source, the optical system being configured to receive the beam and to direct the beam to exit the housing, the beam forming a cone of divergent radiation extending from the housing; and
   a controller operably connected to at least the light source, the controller being configured to vary a characteristic of the beam, during emission of the beam, such that:
      due to the characteristic being varied, the cone of divergent radiation is distinguishable from a background object in a corresponding image generated by a thermal imager detecting the cone of divergent radiation, wherein the thermal imager is located a distance away from the housing, and a portion of the cone of divergent radiation passes directly from the optical system to the thermal imager.

2. The system of claim 1, wherein the characteristic comprises one of a divergence, a wavelength, a power, or an intensity of the beam.

3. The system of claim 1, wherein
   the optical system comprises a substantially transparent window,
   the cone of divergent radiation has a divergence greater than approximately 0.3 radians, and
   the image illustrates a location from which the portion of the cone of divergent radiation exits the housing.

4. The system of claim 1, wherein the housing defines a hermetically sealed environment, and at least the light source and the optical system are disposed within the hermetically sealed environment.

5. The system of claim 1, wherein the optical system comprises a beam shaping optic, and the characteristic is varied, at least in part, by changing a distance along an optical path between the beam shaping optic and the light source.

6. The system of claim 1, wherein the optical system comprises a first beam shaping optic and a second beam shaping optic, and the first beam shaping optic is movable relative to at least the second beam shaping optic.

7. The system of claim 1, wherein:
   the characteristic comprises a divergence of the beam,
   the controller is configured to receive a wireless control signal from a source remote from the light source, and
   the controller is configured to vary the divergence of the beam based at least partly on the wireless control signal.

8. The system of claim 1, wherein:
   the characteristic comprises an intensity of the beam,
   the controller is configured to receive a wireless control signal from a source remote from the light source, and
   the controller is configured to vary the intensity of the beam based at least partly on the wireless control signal.

9. The system of claim 1, wherein the controller is configured to vary the characteristic of the beam based at least in part on a wireless control signal indicative of:
   a location of a target, or
   a location of friendly forces.

10. A system, comprising:
    a housing;
    a light source disposed within the housing and configured to emit a divergent beam of infrared radiation;
    an optical system optically downstream from the light source, the optical system being configured to receive the beam and to direct the beam to exit the housing, the beam forming a cone of divergent radiation external to the housing; and
    a controller operably connected to at least the light source, the controller being configured to vary a characteristic of the beam, during emission of the beam, such that:
       due to the characteristic being varied, the cone of divergent radiation formed by the beam is distinguishable from a background object in a corresponding image generated by a thermal imager detecting the cone, wherein the thermal imager is located a distance away from the housing, and a portion of the cone of divergent radiation passes directly from the optical system to the thermal imager.

11. The system of claim 10, further comprising at least one of a receiver, a transmitter, or a transceiver operably connected to the controller.

12. The system of claim 11, wherein the at least one of the receiver, the transmitter, or the transceiver is capable of radio and data transmission at wireless frequencies, and wherein the data transmission includes data from which the controller determines a control signal indicative of the characteristic of the beam.

13. The system of claim 12, wherein the control signal includes a command for changing at least one of a divergence, an intensity, a pulse rate, an encryption signature, or a wavelength of the beam.

14. The system of claim 11, wherein information exchanged between the at least one of the receiver, the transmitter, or the transceiver and a remote source includes at least one of targeting data, strategic data, signaling data, emission data, operating or control signals, or signals useful in at least one of combat, law enforcement, reconnaissance, stealth location, or marking exercises.

15. The system of claim 10, further comprising a control connected to the housing and operably connected to the controller, the control being operable by a user and configured to provide a control signal to the controller.

16. The system of claim 10, wherein the housing comprises one of a handheld housing or a housing configured to be removably connected to a firearm.

17. A system, comprising:
    a housing;
    a light source disposed within the housing and configured to emit a divergent beam of infrared radiation;
    an optical system optically downstream from the light source, the optical system being configured to receive the beam and to direct the beam to exit the housing, the beam forming a cone of divergent radiation external to the housing; and a controller operably connected to at least the light source, the controller being configured to:

receive information indicative of a beam characteristic, the beam characteristic being associated with a friendly force disposed at a location, and modify the beam, during emission of the beam, in accordance with the beam characteristic such that, due to the beam being modified, the cone of divergent radiation formed by the beam is distinguishable from a background object in a corresponding image generated by a thermal imager detecting the cone, wherein the thermal imager is located a distance away from the housing, and a portion of the cone of divergent radiation passes directly from the optical system to the thermal imager.

18. The system of claim 17, wherein the information is provided by a remote source via wireless communication.

19. The system of claim 17, wherein the housing comprises a portable housing configured to be coupled to an article worn by a user.

20. The system of claim 17, wherein the light source comprises a quantum cascade laser.

* * * * *